(12) United States Patent
Chang et al.

(10) Patent No.: US 11,342,236 B2
(45) Date of Patent: May 24, 2022

(54) WAFER, SEMICONDUCTOR DEVICE AND METHOD FOR MANUFACTURING THE SAME

(71) Applicant: Changxin Memory Technologies, Inc., Anhui (CN)

(72) Inventors: Chih-Wei Chang, Hefei (CN); Changhao Quan, Hefei (CN); Dingyou Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/218,726

(22) Filed: Mar. 31, 2021

(65) Prior Publication Data
US 2021/0217674 A1    Jul. 15, 2021

Related U.S. Application Data

(63) Continuation of application No. PCT/CN2019/119757, filed on Nov. 20, 2019.

(30) Foreign Application Priority Data

Nov. 21, 2018   (CN) .......................... 201811393018.7
Nov. 21, 2018   (CN) .......................... 201821921900.X

(51) Int. Cl.
H01L 23/00      (2006.01)
H01L 21/66      (2006.01)
H01L 23/544     (2006.01)

(52) U.S. Cl.
CPC ............ *H01L 22/34* (2013.01); *H01L 23/544* (2013.01); *H01L 2223/5446* (2013.01)

(58) Field of Classification Search
CPC ................... H01L 22/34; H01L 23/544; H01L 2223/5446
See application file for complete search history.

(56) References Cited

U.S. PATENT DOCUMENTS 5,891,808 A    4/1999  Chang et al.
8,048,778 B1   11/2011 Ku et al.
(Continued)

FOREIGN PATENT DOCUMENTS

CN    102543868 A    7/2012
CN    105826251 A    8/2016
CN    209087831 U    7/2019

OTHER PUBLICATIONS

PCT International Search Report and the Written Opinion dated Mar. 2, 2020, issued in related International Application No. PCT/CN2019/119757 (7 pages).

*Primary Examiner* — Mounir S Amer
*Assistant Examiner* — Alexander Belousov
(74) *Attorney, Agent, or Firm* — Sheppard Mullin Richter & Hampton LLP

(57) ABSTRACT

The present invention provides a wafer, semiconductor device and a method for manufacturing the same, in relation to the field of semiconductor technology. The wafer includes: a substrate; a dielectric layer, disposed on a surface of the substrate; a wafer acceptance test circuit, formed in the dielectric layer; a trench, formed in the dielectric layer and situated on a side of the wafer acceptance test circuit. The wafer acceptance test circuit may comprise a metal interconnection layer. The trench may be filled with a protective layer and has a depth greater than or equal to a depth of the wafer acceptance test circuit. When dicing dies along the scribe line area, the stress caused by dicing can be buffered and cracks may be reduced due to the elasticity of the protective layer. Moreover, the trench and the protective layer filled in the trench can prevent the cracks from extending, thereby improving the yield and stability of the dies.

9 Claims, 13 Drawing Sheets

(56) References Cited

U.S. PATENT DOCUMENTS

| | | |
|---|---|---|
| 9,613,865 B2 | 4/2017 | Liu et al. |
| 9,679,855 B1 * | 6/2017 | Lee .................. H01L 23/3178 |
| 2021/0280466 A1 * | 9/2021 | Fujii .................. H01L 21/78 |

* cited by examiner

WAFER, SEMICONDUCTOR DEVICE AND METHOD FOR MANUFACTURING THE SAME

CROSS-REFERENCE TO RELATED APPLICATIONS

This application is a continuation application of International Patent Application No. PCT/CN2019/119757, filed on Nov. 20, 2019, which is based on and claims priority of the Chinese Patent Application Nos. 201811393018.7 and 201821921900.X, both filed on Nov. 21, 2018 and entitled "WAFER, SEMICONDUCTOR DEVICE AND METHOD FOR MANUFACTURING THE SAME." The above-referenced applications are incorporated herein by reference in their entirety.

TECHNICAL FIELD

The present invention relates generally to the field of semiconductor technology and more specifically, to a wafer, a semiconductor device and a method for manufacturing the same.

BACKGROUND

In the manufacturing process of a semiconductor integrated circuit, a wafer acceptance test (WAT) is required to be carried out on the wafer. Generally, when designing a semiconductor chip, an independent circuit may be arranged in a scribe line area for testing the electrical properties of dies and monitoring any problem that might occur in the manufacturing process. The independent circuit may include metal-oxide-silicon transistors (MOS), vias, metal circuits, etc. The WAT is an electrical test performed on the test structure of the wafer after the manufacturing process is completed.

After the WAT, a packaging process is performed by using a diamond cutter to dice the dies. When the metal circuit is diced, the metal circuit can be easily pulled and cause cracks in the scribe line area, thus affecting the yield and stability of active circuits in the dies. If the cracks are large, the active circuits in the dies are likely to be damaged, thus affecting the yield of the dies.

Therefore, it is desired to provide a new technical solution to solve one or more aforementioned problems.

It should be noted that the information disclosed in this Background section is only for facilitating the understanding of the background of the present invention, and thus may contain information that does not constitute the prior art already known to those of ordinary skill in the art.

SUMMARY

The present invention provides a wafer, a semiconductor device and a method for manufacturing the same, to overcome the technical problem of cracks caused during the dicing process, due to the limitations and drawbacks of related art.

In the first aspect, an embodiment of the present invention provides a wafer having a die area and a scribe line area. The scribe line area may comprise: a substrate; a dielectric layer, disposed on a surface of the substrate; a wafer acceptance test circuit, formed in the dielectric layer; and a trench, formed in the dielectric layer and disposed on a side of the wafer acceptance test circuit. The wafer acceptance test circuit may comprise a metal interconnection layer. The trench may be filled with a protective layer and have a depth greater than or equal to a depth of the wafer acceptance test circuit.

In some embodiments, the wafer acceptance test circuit may be made of one or an alloy material of copper, aluminum, tungsten, or gold.

In some embodiments, the scribe line area may further comprise a test pad disposed on the dielectric layer.

In some embodiments, the trench may surround the wafer acceptance test circuit.

In some embodiments, the trench may have an opening in a direction perpendicular to a dicing direction.

In some embodiments, the protective layer may comprise one or more of polyimide and tetraethyl orthosilicate.

In some embodiments, the trench may have a width ranging from 1 µm to 10 µm, and/or a horizontal distance from the wafer acceptance test circuit ranging from 1 µm to 10 µm.

In some embodiments, the trench may have the depth greater than the depth of the wafer acceptance test circuit by more than 100 nm.

In some embodiments, the trench may have a vertical section in a rectangular or inverted trapezoidal shape.

In some embodiments, the trench may have a horizontal section view in a rectangular, circular or elliptical shape.

In some embodiments, the trench may have the horizontal section view in a multi-layered rectangular, circular or elliptical shape.

In the second aspect, an embodiment of the present invention provides a semiconductor device, comprising the wafer described above.

In the third aspect, an embodiment of the present invention provides a method for fabricating a semiconductor device. The method may comprise: providing a substrate; forming a dielectric layer comprising a wafer acceptance test circuit on the substrate; forming a test pad on the dielectric layer comprising the wafer acceptance test circuit; forming a trench in the dielectric layer and disposed on a side of the wafer acceptance test circuit; depositing a protective layer in the trench; and forming an opening in the protective layer by photolithography to expose the test pad. The trench may have a depth greater than or equal to a depth of the wafer acceptance test circuit. The wafer acceptance test circuit and the trench may be located in a scribe line area.

In some embodiments, the wafer acceptance test circuit may be made of one or an alloy material of copper, aluminum, tungsten, or gold.

In some embodiments, the protective layer may comprise one or more of polyimide and tetraethyl orthoilicate.

In some embodiments, the trench may have a width ranging from 1 µm to 10 µm, and/or a horizontal distance from the wafer acceptance test circuit ranging from 1 µm to 10 µm.

In some embodiments, the trench may have a vertical section in a rectangular or inverted trapezoidal shape.

In some embodiments, the trench may have a horizontal section view in a rectangular, circular or elliptical shape.

In some embodiments, the trench may have the horizontal section view in a multi-layered rectangular, circular or elliptical shape.

In some embodiments, the trench may have the depth greater than the depth of the wafer acceptance test circuit by more than 100 nm.

Since the trench may be formed in the scribe line area, disposed on the side of the WAT circuit, and filled with the protective layer, the stress caused by dicing can be buffered and cracks can be reduced during the process of dicing the dies along the scribe line area.

It is to be understood that both the above general description and the following detailed description are exemplary and explanatory only and are not restrictive of the present invention.

BRIEF DESCRIPTION OF THE DRAWINGS

The accompanying drawings, which are incorporated herein as a part of the specification, show embodiments of the present invention, and explain the theories and principles of the present invention together with the specification. Apparently, the drawings described below only show some of the embodiments of the present invention, and other drawings may be obtained based on these drawings by those skilled in the art without creative work.

DETAILED DESCRIPTION OF THE EMBODIMENTS

Figure 1A:
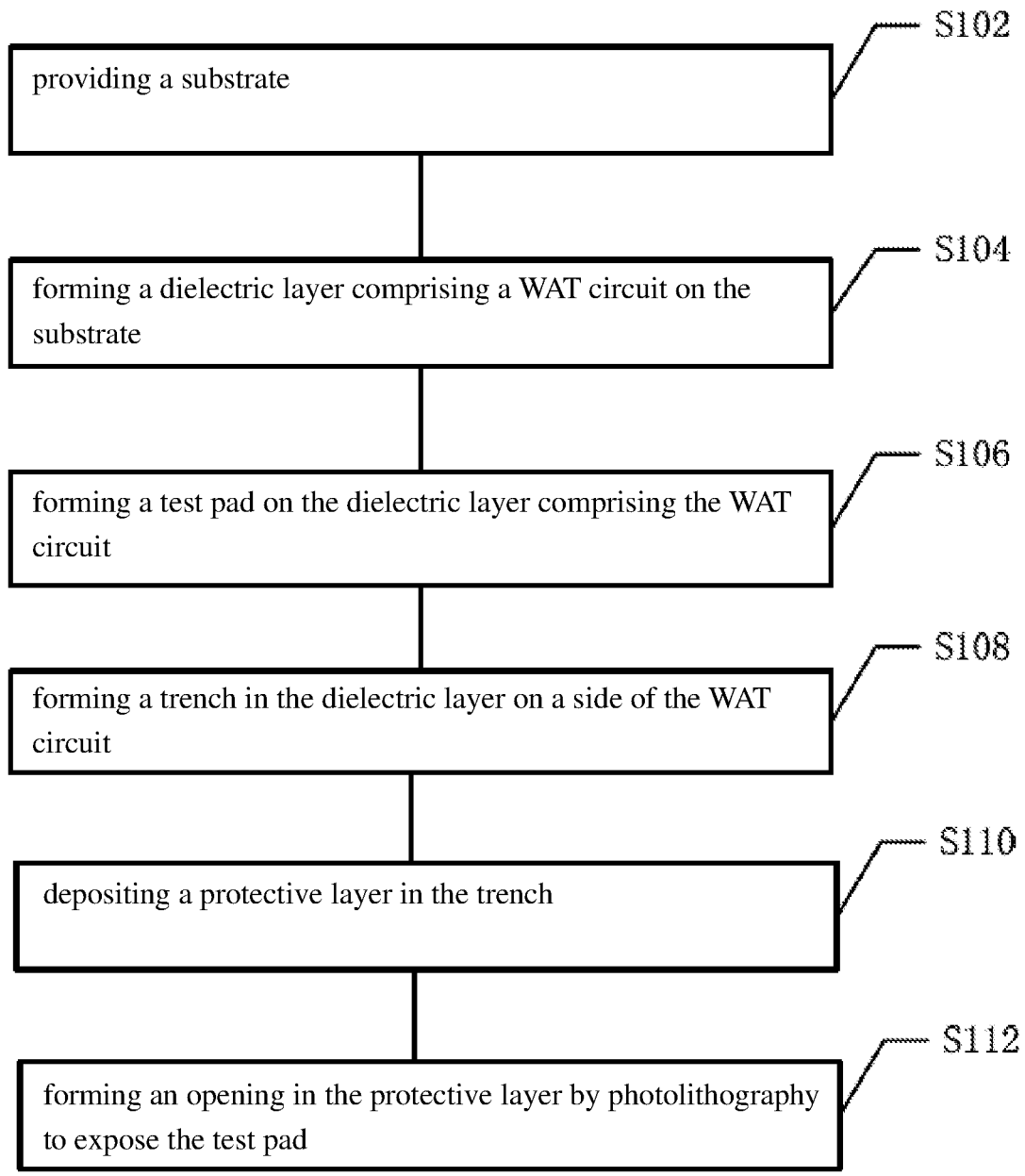
FIG. 1A is a flowchart of a method for manufacturing a semiconductor device in accordance with one embodiment of the present invention.

Exemplary embodiments will now be described in details with reference to the accompanying drawings. However, the exemplary embodiments can be implemented in a variety of forms and should not be construed as being limited to those set forth herein. Rather, these embodiments are presented to provide a full and thorough understanding of the present invention, and to fully convey the concepts of the embodiments to those skilled in the art. The described features, structures, or characteristics may be combined in any suitable manner in one or more embodiments.

In addition, the accompanying drawings are merely schematic diagrams of the present invention and are not necessarily drawn to scale. The same reference numerals in the accompanying drawings may indicate the same or analogous parts, and duplicate detailed description thereof will thus be omitted.

In the related art, an independent WAT circuit may be placed in a scribe line area of a wafer for testing the electrical properties of dies. The WAT circuit may include a metal interconnection layer in the dielectric layer disposed on the substrate. A test pad may be further formed on the dielectric layer.

Figure 2A:
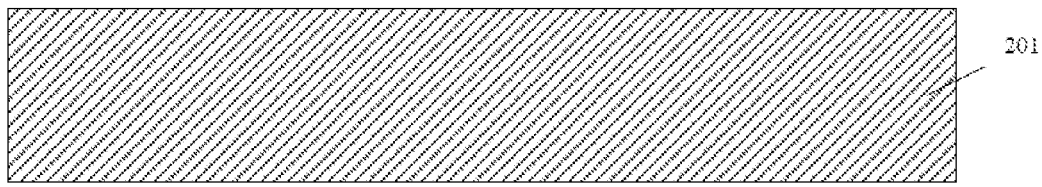
FIGS. 2A, 2B, 2C, 2D, 2E, 2F, and 2G are cross section views of a semiconductor device in various stages of a method for manufacturing the semiconductor device in accordance with one embodiment of the present invention.
Figure 2B:
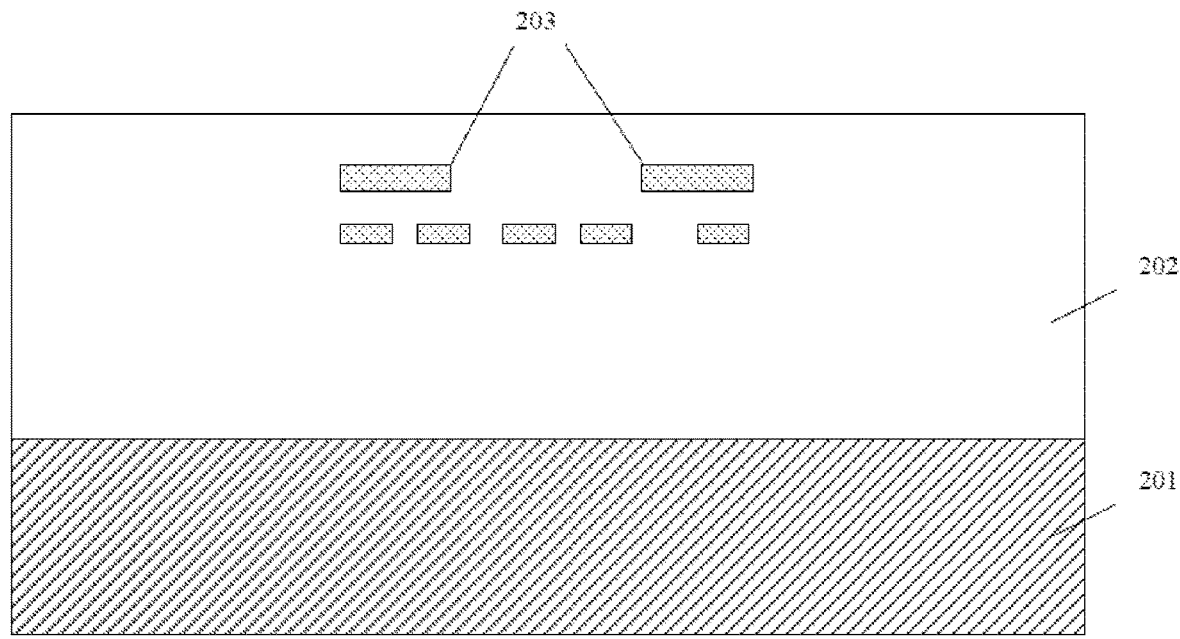
Figure 2C:
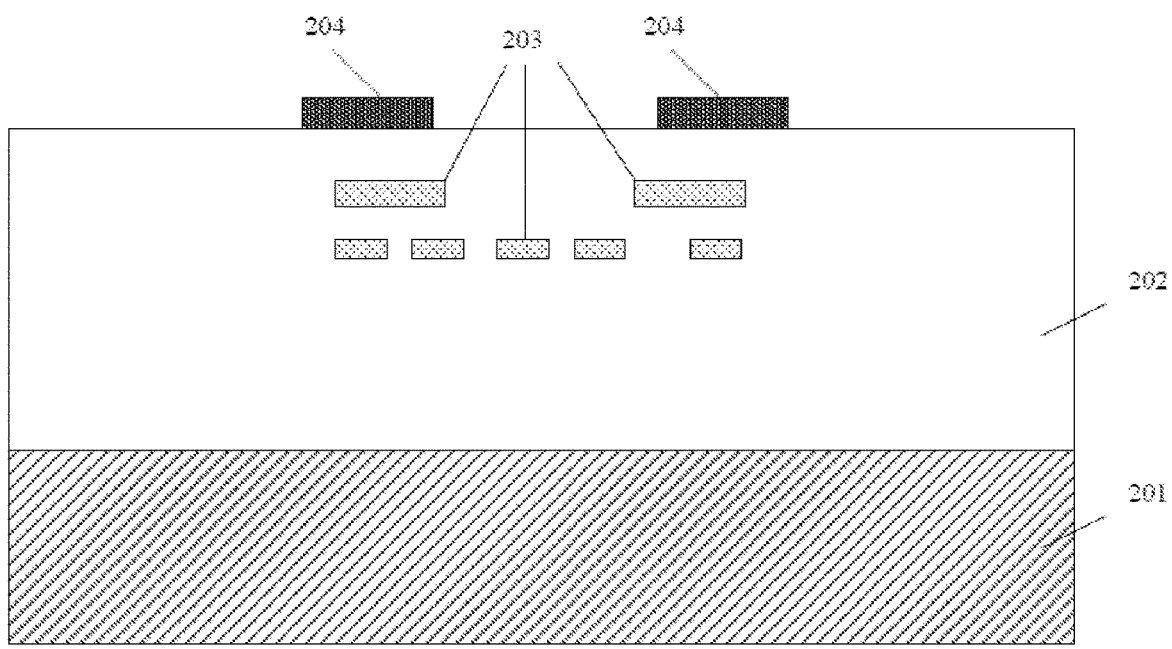
Figure 2D:
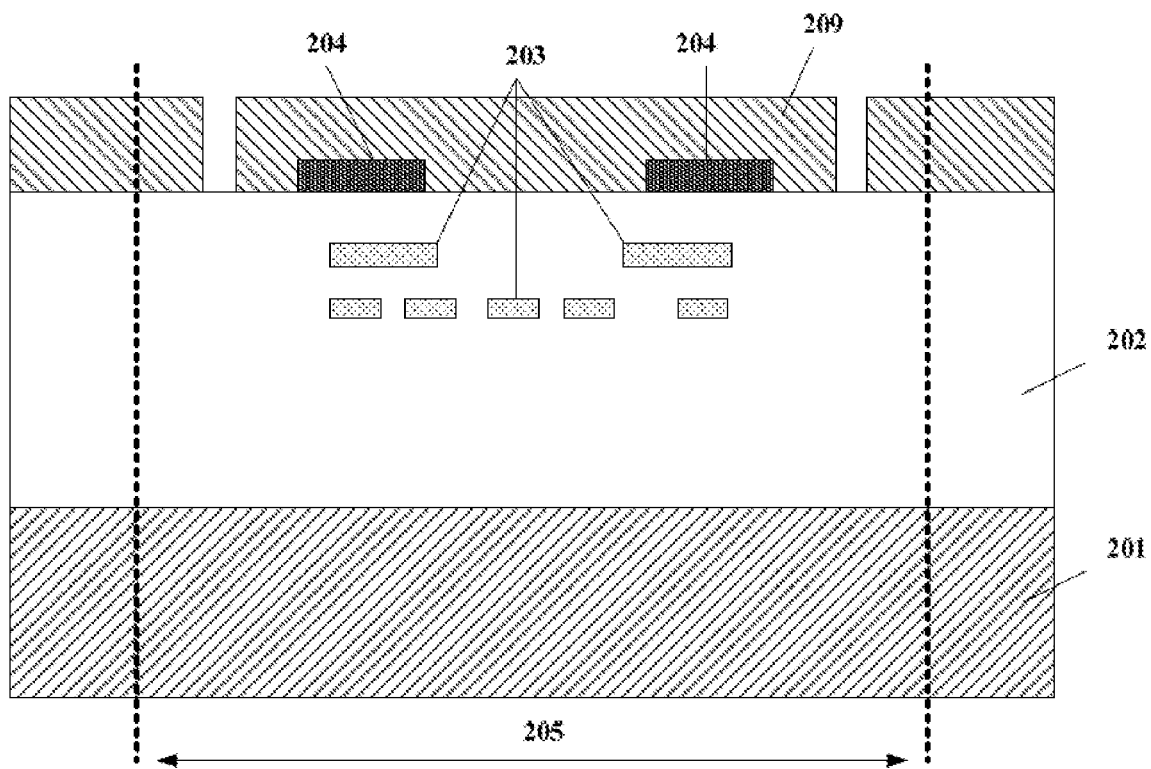
Figure 2E:
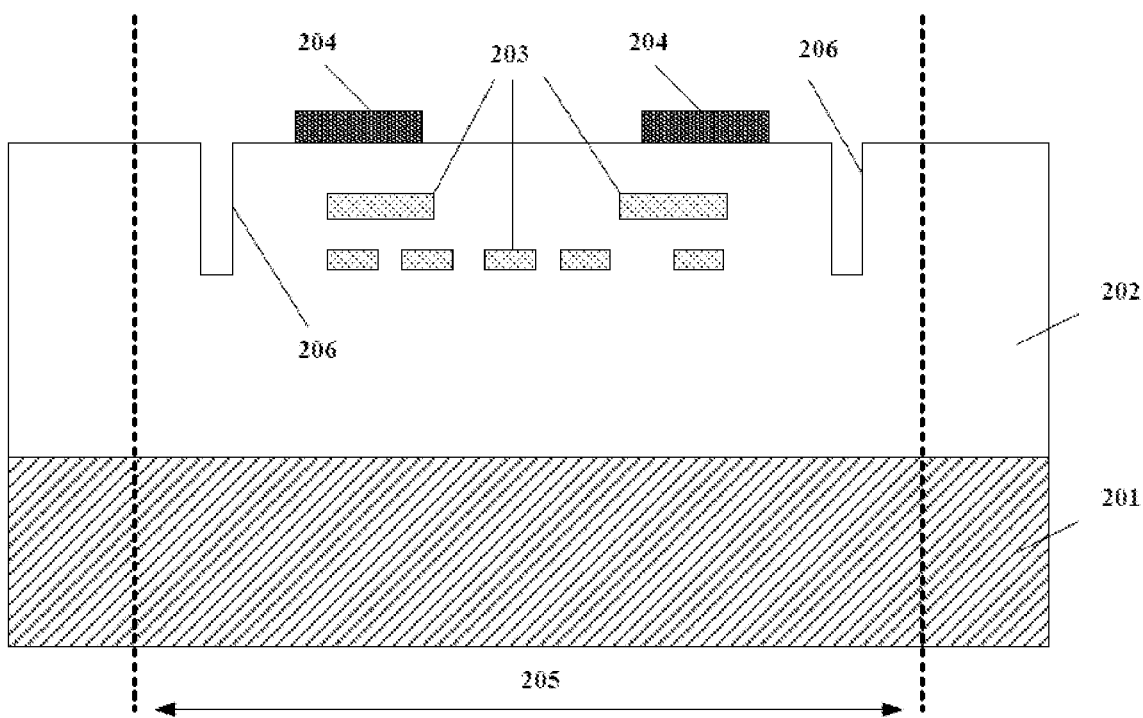
Figure 2F:
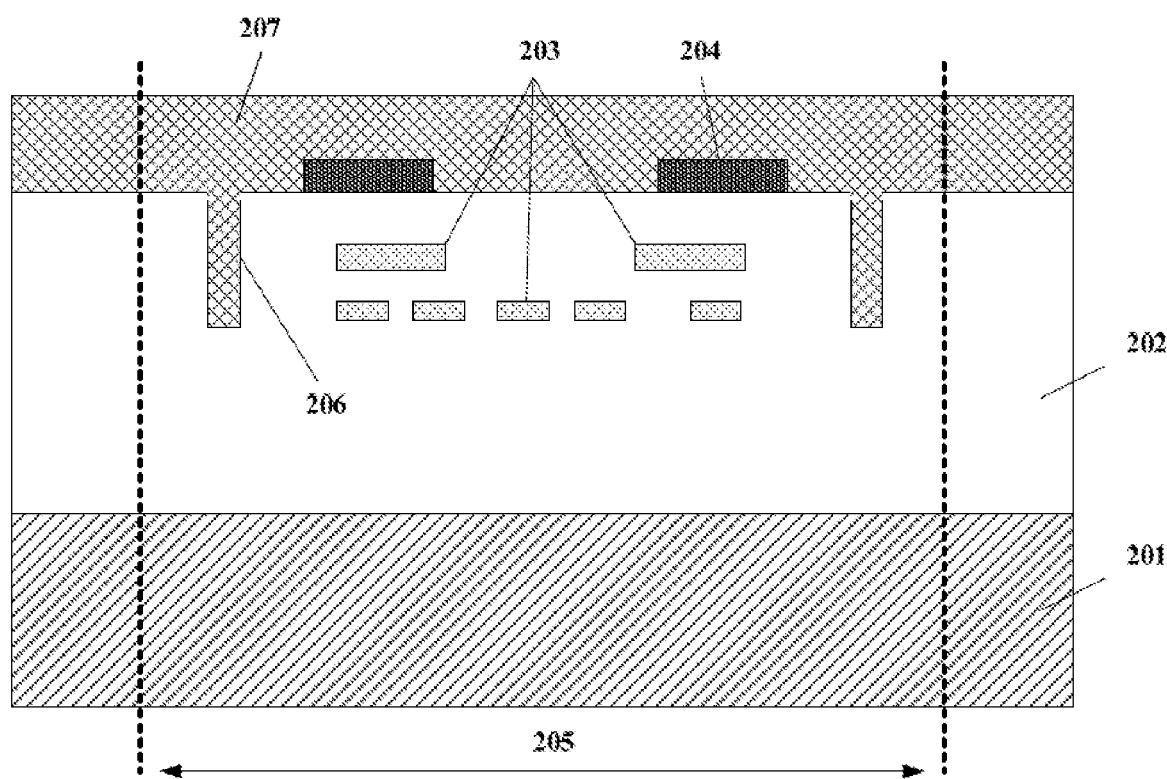
Figure 2G:
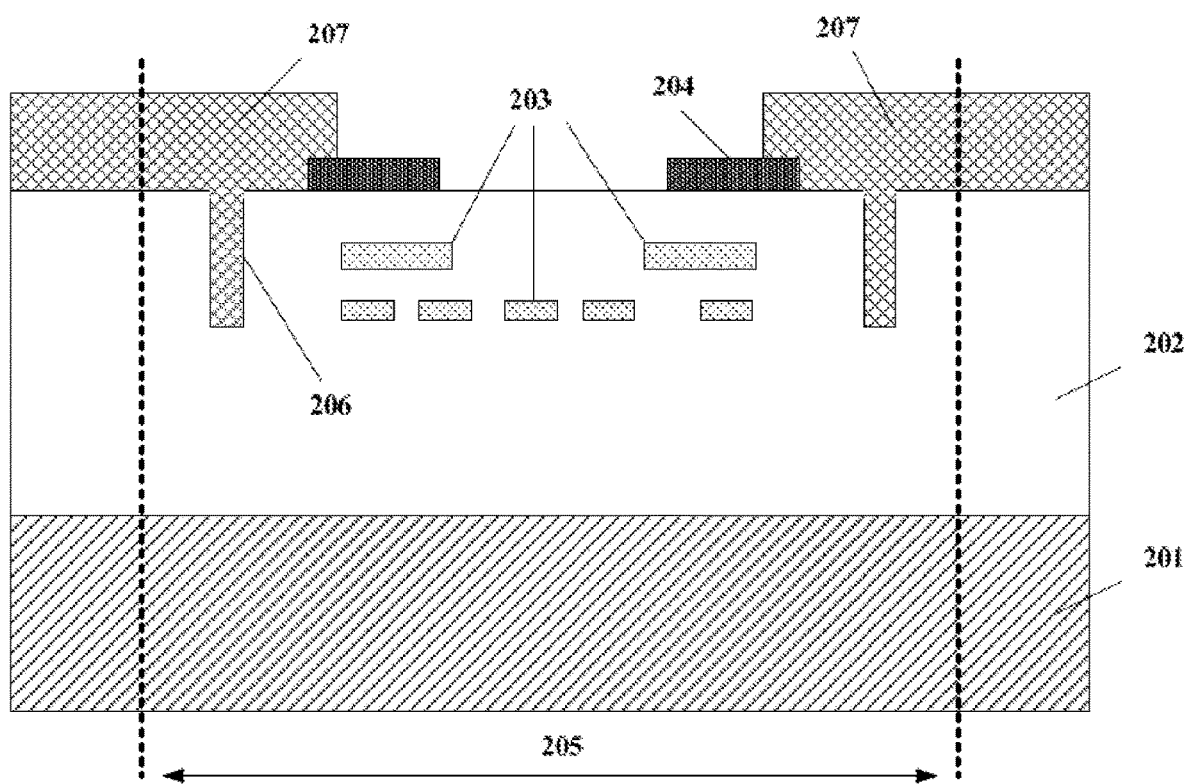

Referring to FIG. 2G, one embodiment of the present invention provides an improved semiconductor device. The semiconductor device may include a scribe line area 205 including a substrate 201, a dielectric layer 202 disposed on the substrate 201, a WAT circuit 203 formed in the dielectric layer 202, and a trench 206 formed in the dielectric layer 202 and disposed on a side of the WAT circuit 203. The trench 206 may have an opening on the surface of the dielectric layer 202, and may be filled with a protective layer 207. The trench 206 may have a depth greater than or equal to a depth of the WAT circuit 203. In other words, a surface of the trench 206 closer to the substrate 201 is at a lower level than or at the same level, in depth, with a surface of the metal interconnection layer of the WAT circuit 203 closer to the substrate 201.

A method for manufacturing the semiconductor device will be described below with reference to the accompanying drawings.

FIG. 1A is a flowchart of a method for manufacturing a semiconductor device in accordance with one embodiment of the present invention.

Referring to FIG. 1A, in step S102, a substrate is provided.

In some embodiments of the present invention, the substrate may be a silicon epitaxial wafer, a silicon-on-insulator (SOI) substrate, or a substrate of other semiconductor materials such as GaN. And the substrate may be an intrinsic semiconductor substrate, or an N-doped or P-doped semiconductor substrate, which is not limited in the embodiments of the present invention.

In step S104, a dielectric layer comprising a WAT circuit on the substrate may be formed.

In some embodiments of the present invention, the material of the dielectric layer may be one or more of silicon oxide, silicon nitride, or silicon oxynitride. When implementing the embodiments, the dielectric layer may be formed by chemical vapor deposition, atomic layer deposition, or the like. It can be understood that the dielectric layer may be one layer of insulating material or multiple layers of the same or different insulating materials.

In some embodiments of the present invention, the WAT circuit may be one or more metal layers. In the latter case, electrical connections between two of the metal layers may be achieved by conductive pillars. The material of the metal layers and the material of the conductive pillars may be the same, thus making it easier to manufacture in a uniform process. The material of the metal layer may be one or an alloy material of copper, aluminum, tungsten, gold or the like.

Forming a dielectric layer including a WAT circuit on the substrate in accordance with one embodiment will be described with reference to FIG. 1B.

Figure 1B:
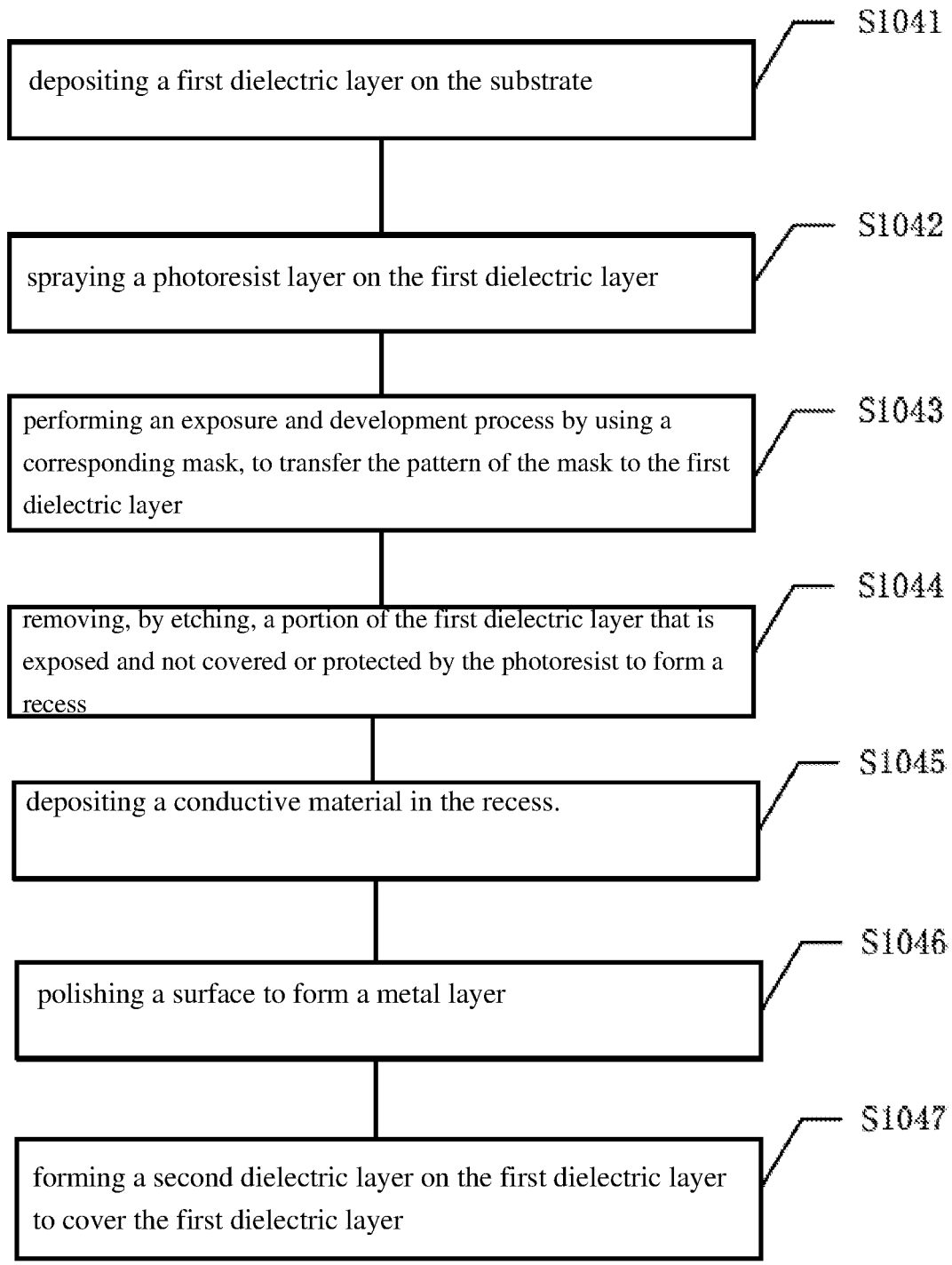
FIG. 1B is a flowchart of forming a dielectric layer including a WAT circuit on a substrate in accordance with one embodiment of the present invention.

Referring to FIG. 1B, in step S1041, a first dielectric layer may be deposited on the substrate. The depositing process may be implemented by chemical vapor deposition, atomic layer deposition, or the like.

In step S1042, a photoresist layer may be sprayed on the first dielectric layer.

In step S1043, an exposure and development process may be performed by using a corresponding mask, to transfer a pattern of the mask to the first dielectric layer.

In step S1044, a portion of the first dielectric layer that is exposed and not covered or protected by the photoresist may be removed by etching to form a recess. The etching process may be implemented by dry etching, wet etching, or plasma etching.

In step S1045, a conductive material may be deposited in the recess. The depositing process may be implemented by physical vapor deposition or electroplating.

In step S1046, a surface may be polished to form a metal layer. The polishing process may be implemented by chemical mechanical polishing.

In step S1047, a second dielectric layer may be formed on the first dielectric layer to cover the first dielectric layer.

Multiple metal layers may be formed by repeating the above steps.

If two of the metal layers need to be connected through conductive pillars, the exposure and development process may be performed on the dielectric layer between the two metal layers to form vias, and then metal may be deposited into the vias, thereby forming the conductive pillars to electrically connect the two metal layers.

In step S106, a test pad may be formed on the dielectric layer comprising the WAT circuit.

In some embodiments of the present invention, the test pad may be formed by the following steps: depositing the metal layer on a surface of the dielectric layer, forming the photoresist layer on the metal layer, transferring the pattern to the metal layer by photolithography, and forming the required test pad by etching. The test pad may be connected to the underlying metal layer by the conductive pillars.

In step S108, a trench may be formed in the dielectric layer on a side of the WAT circuit. The trench may have a depth greater than or equal to the depth of the WAT circuit. The trench may be formed by a mask-lithography process.

Figure 1C:
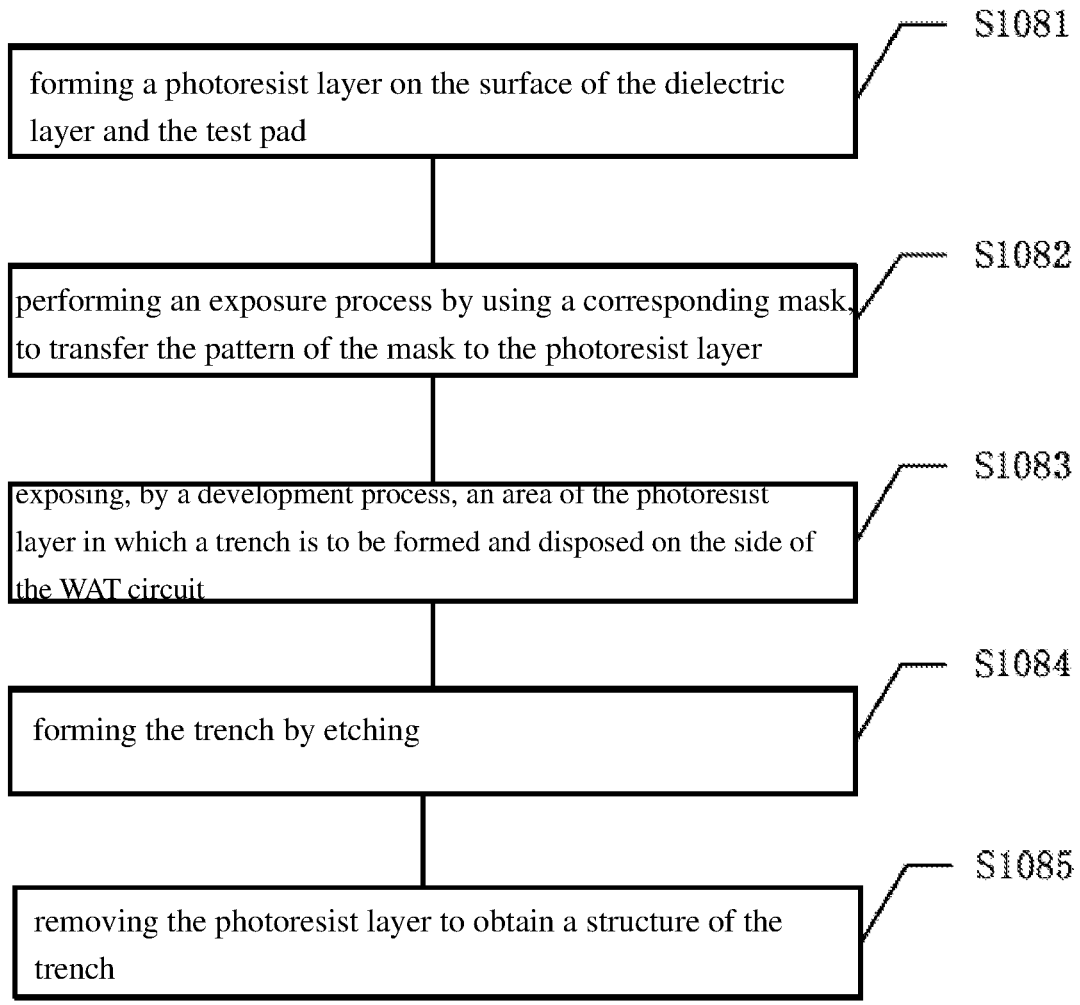
FIG. 1C is a flowchart of forming a trench by a mask-lithography process in accordance with one embodiment of the present invention.

In some embodiments of the present invention, referring to FIG. 1C, the mask-lithography process may include the following steps.

In step S1081, a photoresist layer may be formed on the surface of the dielectric layer and the test pad;

In step S1082, an exposure process may be performed by using a corresponding mask, to transfer a pattern of the mask to the photoresist layer;

In step S1083, an area of the photoresist layer in which a trench is to be formed and disposed on the side of the WAT circuit may be exposed by a development process;

In step S1084, the trench may be formed by etching. The etching process may be implemented by dry etching, wet etching, or plasma etching;

In step S1085, the photoresist layer may be removed to obtain a structure of the trench.

In step S110, a protective layer may be deposited in the trench. The protective layer may be formed in the trench and on the surface of the test pad and the dielectric layer, for example, by chemical vapor deposition or atomic layer deposition. The material of the protective layer may be one or more of polyimide and tetraethyl orthosilicate (TEOS).

In step S112, an opening may be formed in the protective layer by photolithography to expose the test pad.

In some embodiments of the present invention, the photolithography to expose the test pad may comprise the following steps: forming the photoresist layer on the protective layer, transferring the pattern to the protective layer by photolithography, and etching the exposed protective layer to expose the test pad.

In the above embodiments, in the scribe line area, the trench may be formed on the side of the WAT circuit, and the trench may be filled with a protective layer. By doing so, when dicing the dies along the scribe line area, the stress caused by dicing can be buffered, and cracks can be reduced. Moreover, the protective layer filled in the trench can prevent the cracks from extending, thereby improving the yield and stability of the dies.

FIGS. 2A-2G are cross section views of a semiconductor device in various stages of a method for manufacturing the semiconductor device in accordance with one embodiment of the present invention.

Referring to FIG. 2A, a substrate 201 may be provided.

Referring to FIG. 2B, a dielectric layer 202 including a WAT circuit 203 may be formed on the substrate 201.

Referring to FIG. 2C, test pads 204 may be formed on the dielectric layer 202. The test pads 204 may usually be disposed above the WAT circuit 203.

Referring to FIG. 2D, a photoresist 209 may be coated on the dielectric layer 202, and lithography may be performed to form a pattern for forming a trench.

Referring to FIG. 2E, the trench 206 may be formed by etching, and the photoresist 209 may be removed.

Referring to FIG. 2F, a protective layer 207 may be deposited over the trench 206 and dielectric layer 202.

Referring to FIG. 2G, the protective layer 207 may be exposed and developed to expose the test pads 204 for testing.

In the above embodiments, the WAT circuit 203, the test pad 204, and the trench 206 may be all located in the scribe line area 205.

Referring to FIG. 2G, the semiconductor device formed by the semiconductor manufacturing method similar to the above may include a scribe line area 205. The scribe line area 205 may include: the substrate 201; the dielectric layer 202 on the substrate 201; the WAT circuit 203 formed in the dielectric layer 202; and the trench 206 formed in the dielectric layer 202 and surrounds the WAT circuit 203. The trench 206 may have an opening on a surface of the dielectric layer 202 away from the substrate 201, and the trench 206 may be filled with the protective layer 207. The trench 206 may have a depth greater than or equal to a depth of the WAT circuit.

In some embodiments, the depth of the trench may be greater than the depth of the WAT circuit by 100 nm.

In some embodiments, the wafer may include the die area and the scribe line area as described above.

Figure 3:
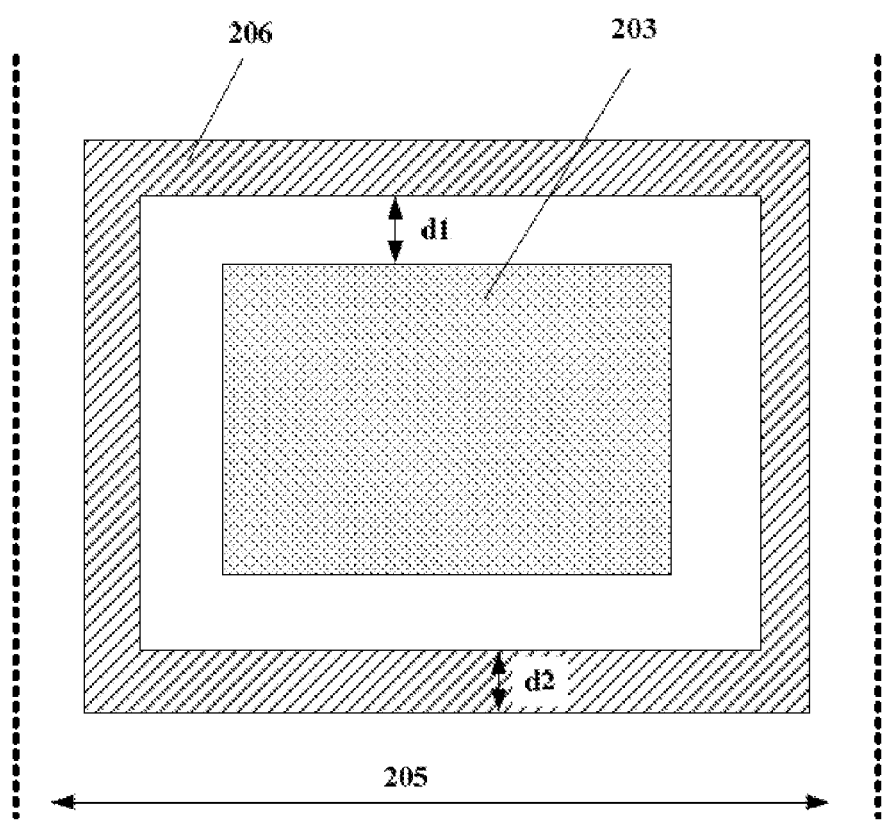
FIG. 3 is a horizontal section view of a semiconductor device in accordance with one embodiment of the present invention.

FIG. 3 is a horizontal section view of a semiconductor device in accordance with one embodiment of the present invention. Referring to FIG. 3, the horizontal section view of the trench 206 may be in a shape of a closed rectangle that surrounds the WAT circuit 203.

In some embodiments, the distance d1 between the trench 206 and the WAT circuit 203 may range from 1 μm to 10 μm. For example, the distance d1 between the trench 206 and the WAT circuit 203 may be 3 μm, 5 μm, or 7 μm.

In some embodiments, the width d2 of the trench 206 may range from 1 μm to 10 μm. For example, the width d2 of the trench 206 may be 3 μm, 5 μm, or 7 μm.

Figure 4:
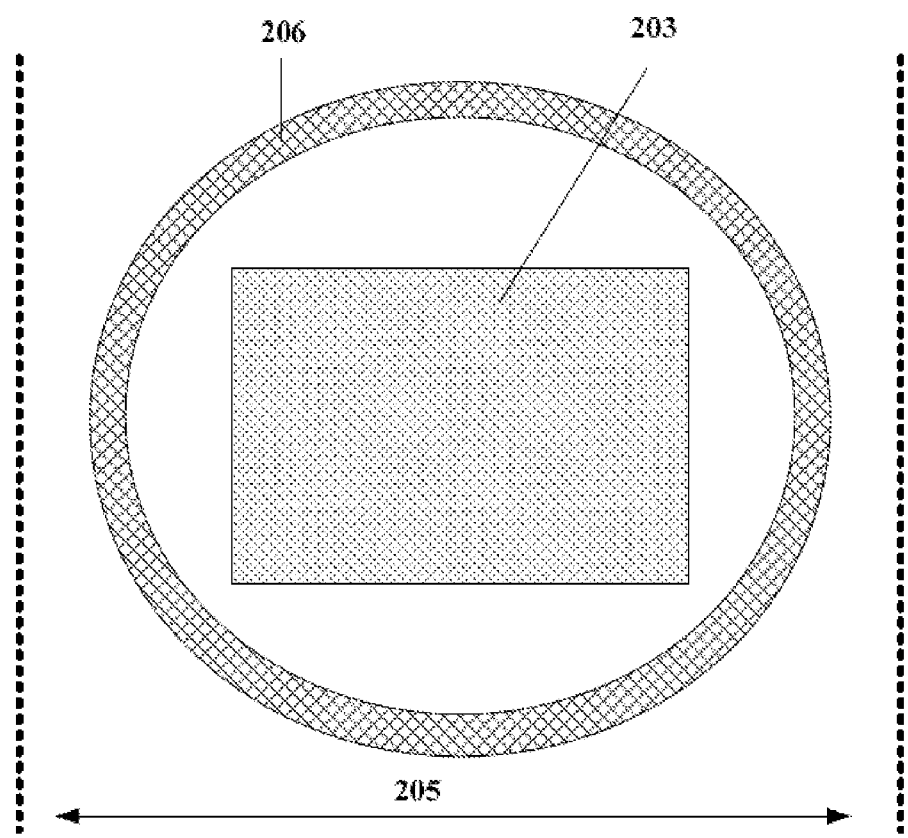
FIG. 4 is a horizontal section view of a semiconductor device in accordance with one embodiment of the present invention.

FIG. 4 is a horizontal section view of a semiconductor device in accordance with one embodiment of the present invention. Referring to FIG. 4, the horizontal section view of the trench 206 may be in a shape of a circle that enclose the WAT circuit 203.

In some embodiments, the distance between the trench 206 and the WAT circuit 203 may range from 1 μm to 10 μm. For example, the distance between the trench 206 and the WAT circuit 203 may be 3 μm, 5 μm, or 7 μm.

Figure 5:
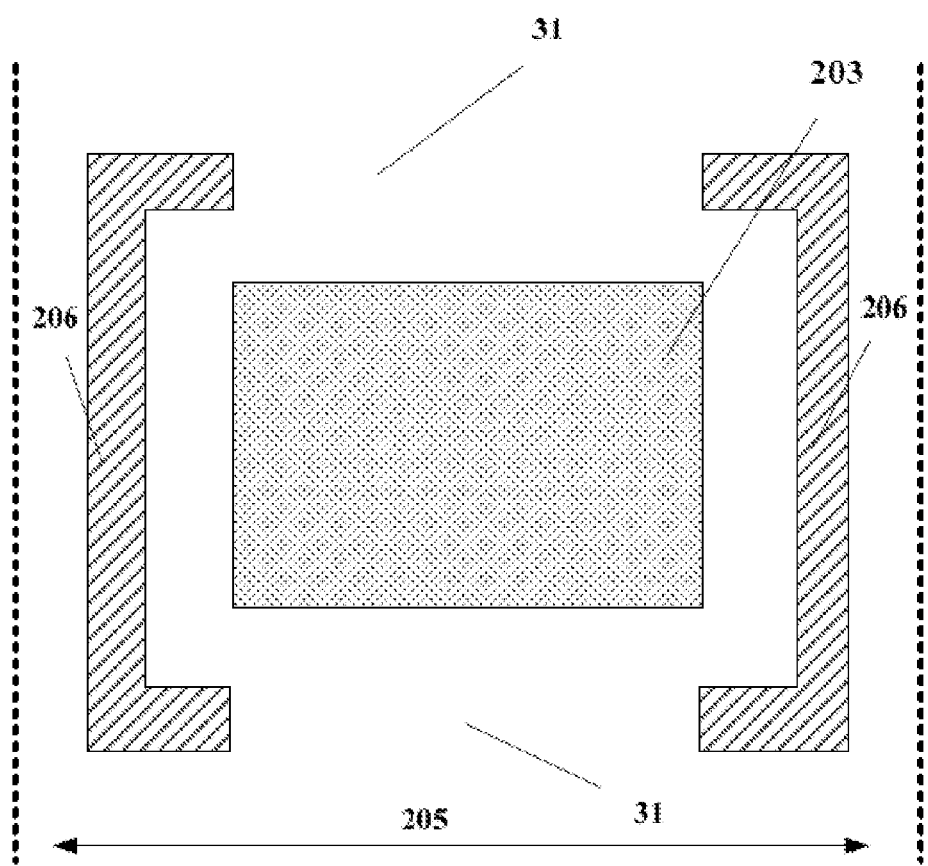
FIG. 5 is a horizontal section view of a semiconductor device in accordance with one embodiment of the present invention.

FIG. 5 is a horizontal section view of a semiconductor device in accordance with one embodiment of the present invention. Referring to FIG. 5, the horizontal section view of the trench 206 may be in a shape of a non-closed rectangle that include openings 31 in a direction perpendicular to the dicing direction.

Figure 6:
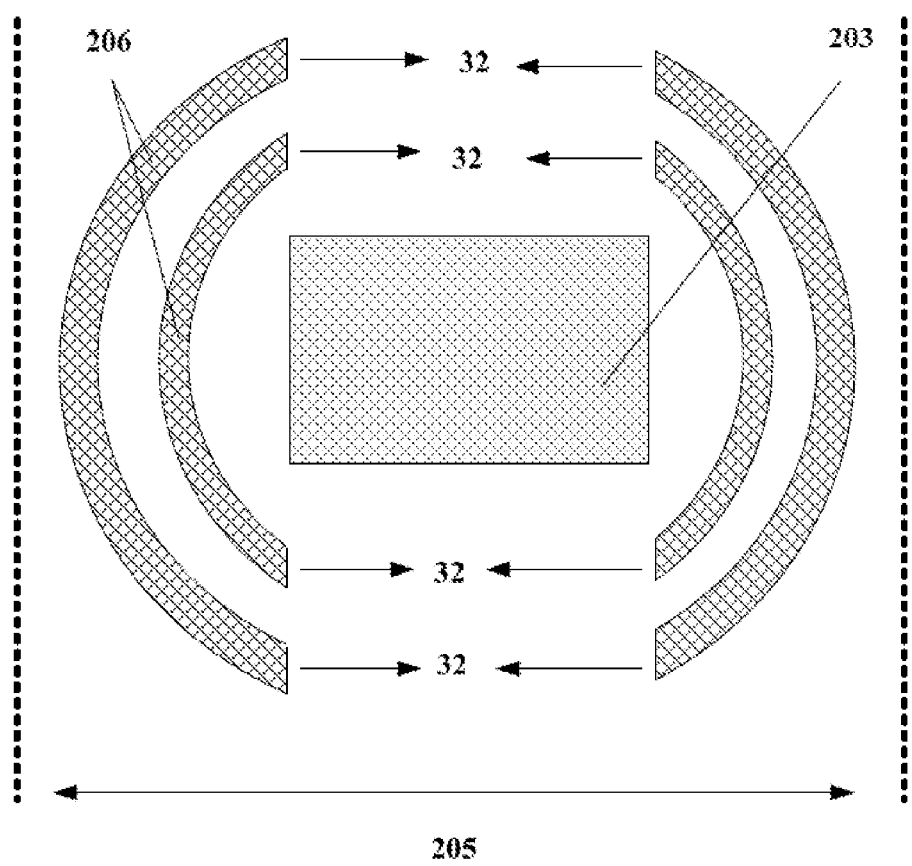
FIG. 6 is a horizontal section view of a semiconductor device in accordance with one embodiment of the present invention.

FIG. 6 is a horizontal section view of a semiconductor device in accordance with one embodiment of the present invention. Referring to FIG. 6, the horizontal section view of the trench 206 may be in a shape of two non-closed circles that include openings 32 in a direction perpendicular to the dicing direction. The protective layer 207 may have an opening in a direction perpendicular to the dicing direction, thus a non-closed protective layer may be formed. In this case, no protective layer 207 may exist in the dicing direction for dicing by the diamond cutter thus preventing the protective layer 207 from warping or rolling up, while the protective layer 207 in the trench 206 can still prevent the extension of the cracks. Moreover, the multi-layered protective trench 206 can better prevent the cracks from extending into the inner of the dies.

In some embodiments, the horizontal section view of the trench 206 may be in other shapes such as an ellipse.

Figure 7:
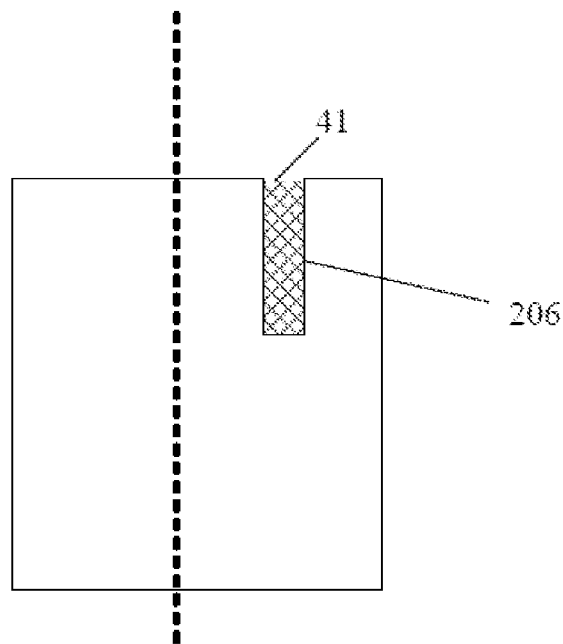
FIG. 7 is a vertical section view of a semiconductor device in accordance with one embodiment of the present invention.

FIG. 7 is a vertical section view of a semiconductor device in accordance with one embodiment of the present invention. Referring to FIG. 7, the vertical section of the trench 206, which is perpendicular to the substrate 201, may have a rectangular shape, and the opening 41 of the trench 206 may be disposed on the surface of the dielectric layer 202 facing away from the substrate 201.

Figure 8:
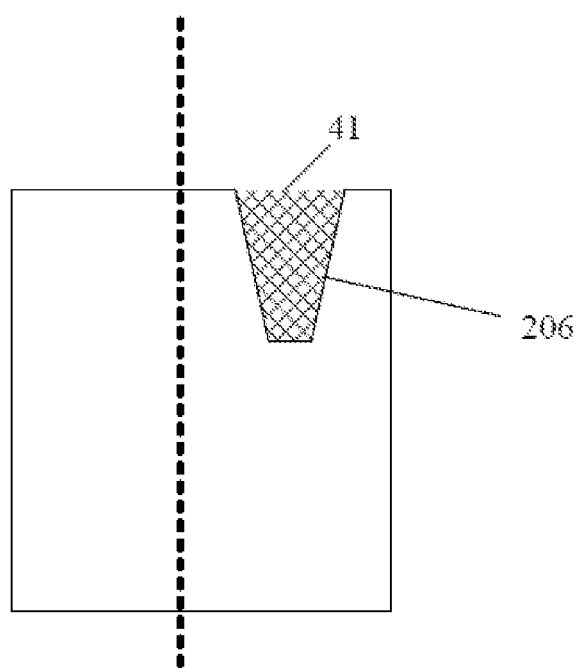
FIG. 8 is a vertical section view of a semiconductor device in accordance with one embodiment of the present invention.

FIG. 8 is a vertical section view of a semiconductor device in accordance with one embodiment of the present invention. Referring to FIG. 8, the vertical section of the trench 206, which is perpendicular to the substrate 201, may be in a shape of an inverted trapezoid, and the opening 41 of the trench 206 may be disposed on the surface of the dielectric layer 202 away from the substrate 201.

In some embodiments, the bottom of the trench 206, which is the surface closer to the substrate 201, may have a width ranging from 1 μm to 10 μm, for example, of 3 μm, 5 μm, or 7 μm. The opening 41 of the trench 206, which is away from the substrate 201, may have a width ranging from 2 μm to 12 μm, for example, of 4 μm, 6 μm, 8 μm or 10 μm, and the width of the opening 41 may be greater than that of the bottom of the trench 206.

It should be noted that it's easier for the protective layer 207 to fully fill up the trench 206 when the trench 206 has the vertical section in a shape of inverted trapezoid. Also, as cracks usually occur from the top during dicing, it's easier for the protective layer 207 with a wider top to prevent cracks from extending to the die area.

Figure 9:
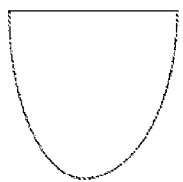
FIG. 9 is a schematic diagram of vertical section view of a semiconductor device in accordance with one embodiment of the present invention.

In addition, it should be noted that when the trench is in the etching process in practice, the bottom of the formed rectangle or inverted trapezoid is usually not horizontal, but instead is zigzag or curved with a certain curvature. Referring to FIG. 9, the bottom of the trench 206 may have a curvature, and may resemble an inverted trapezoid or an inverted triangle.

Other embodiments of the present invention will be readily apparent to those skilled in the art after considering the specification and implementing the embodiments disclosed herein. Accordingly, the present invention is intended to cover any and all variations, uses, or adaptations of the present invention which follow, in general, the principles of the invention and include departures from the present invention as come within common knowledge or customary practice within the art to which the invention pertains. The specification and embodiments are illustrative and exemplary only, with true scope and spirit of the present invention being carried out by the appended claims.

The invention claimed is:

1. A wafer having a die area and a scribe line area, wherein the scribe line area comprises:
    a substrate;
    a dielectric layer, disposed on a surface of the substrate;
    a wafer acceptance test circuit, formed in the dielectric layer, wherein the wafer acceptance test circuit comprises a metal interconnection layer; and
    a first trench and a second trench, formed in the dielectric layer and respectively disposed on opposing sides of the wafer acceptance test circuit, the first trench formed between first ends, and the second trench formed between second ends,
    wherein the first trench and the second trench are each filled with a protective layer and have a depth greater than or equal to a depth of the wafer acceptance test circuit, and wherein, when viewed along a viewing direction perpendicular to an upper surface of the substrate, each of the first ends of the first trench is facing a corresponding second end of the second trench along a direction perpendicular to a dicing direction.

2. The wafer of claim 1, wherein the wafer acceptance test circuit is made of one or an alloy material of copper, aluminum, tungsten, or gold.

3. The wafer of claim 1, wherein the scribe line area further comprises a test pad disposed on the dielectric layer.

4. The wafer of claim 1, wherein the first trench and the second trench surround the wafer acceptance test circuit.

5. The wafer of claim 1, wherein the protective layer comprises one or more of polyimide and tetraethyl orthosilicate.

6. The wafer of claim 1, wherein the first trench and the second trench each have a width ranging from 1 μm to 10 μm, and/or a horizontal distance from the wafer acceptance test circuit ranging from 1 μm to 10 μm.

7. The wafer of claim 1, wherein the first trench and the second trench each have the depth greater than the depth of the wafer acceptance test circuit by more than 100 nm.

8. The wafer of claim 1, wherein the first trench and the second trench each have a vertical section in a rectangular or inverted trapezoidal shape.

9. A semiconductor device, comprising the wafer of claim 1.

* * * * *